(12) United States Patent
Popovici

(10) Patent No.: US 9,431,474 B2
(45) Date of Patent: Aug. 30, 2016

(54) METAL-INSULATOR-METAL STACK AND METHOD FOR MANUFACTURING THE SAME

(71) Applicant: IMEC, Leuven (BE)

(72) Inventor: Mihaela Ioana Popovici, Leuven (BE)

(73) Assignee: IMEC, Leuven (BE)

( * ) Notice: Subject to any disclaimer, the term of this patent is extended or adjusted under 35 U.S.C. 154(b) by 178 days.

(21) Appl. No.: 13/705,512

(22) Filed: Dec. 5, 2012

(65) Prior Publication Data

US 2013/0155572 A1   Jun. 20, 2013

(30) Foreign Application Priority Data

Dec. 20, 2011   (EP) .................................... 11194690

(51) Int. Cl.
| | |
|---|---|
| *B05D 5/12* | (2006.01) |
| *H01L 49/02* | (2006.01) |
| *H01G 4/008* | (2006.01) |
| *H01L 21/3205* | (2006.01) |
| *B05D 7/00* | (2006.01) |
| *H01L 21/02* | (2006.01) |

(52) U.S. Cl.
CPC ................ *H01L 28/57* (2013.01); *H01L 28/56* (2013.01); *B05D 5/12* (2013.01); *B05D 7/50* (2013.01); *H01G 4/008* (2013.01); *H01L 21/02* (2013.01); *H01L 21/3205* (2013.01); *H01L 49/02* (2013.01)

(58) Field of Classification Search
USPC .............................................. 427/79–81, 532
See application file for complete search history.

(56) References Cited

U.S. PATENT DOCUMENTS

| | | | | |
|---|---|---|---|---|
| 3,234,044 | A * | 2/1966 | Andes et al. .................. | 430/296 |
| 3,523,039 | A * | 8/1970 | Ramsey, Jr. ................... | 428/212 |
| 3,532,489 | A | 10/1970 | Wienert | |
| 4,756,756 | A * | 7/1988 | Cassat ........................... | 524/261 |
| 8,318,572 | B1 | 11/2012 | Shanker et al. | |
| 2002/0074584 | A1 | 6/2002 | Yang | |
| 2009/0246357 | A1 * | 10/2009 | Liou et al. .................... | 427/97.3 |
| 2010/0327410 | A1 | 12/2010 | Park et al. | |

(Continued)

OTHER PUBLICATIONS

Tsai et al. "High reliability Ta2O5 Metal-insulator-metal capacitors with Cu based electrodes" Journal of Electrochemical Society, vol. 153, (5), pp. G492-G497 (2006).*

(Continued)

*Primary Examiner* — Brian K Talbot
(74) *Attorney, Agent, or Firm* — McDonnell Boehnen Hulbert & Berghoff LLP

(57) ABSTRACT

A method for manufacturing a metal-insulator-metal (MIM) stack is described. The method includes forming a temporary stack by depositing a bottom electrode comprising at least one metal layer; depositing a dielectric comprising at least one layer of a dielectric material having a first dielectric constant value; and depositing a top electrode comprising at least one metal layer. The step of depositing the bottom and/or top electrode includes depositing a non-conductive metal oxide layer directly in contact with the dielectric; and after the step of depositing the bottom and/or top electrode's non-conductive metal oxide layer and the dielectric, subjecting the temporary stack to a stimulus, which transforms the non-conductive metal oxide into a thermodynamically stable oxide having conductive properties or into a metal, and the dielectric material into a crystalline form having a second dielectric constant value higher than the first dielectric constant value, thereby creating the final MIM stack.

7 Claims, 4 Drawing Sheets

(56) References Cited

U.S. PATENT DOCUMENTS

| | | | |
|---|---|---|---|
| 2011/0000875 A1* | 1/2011 | Antonov | H01L 21/02175 216/13 |
| 2011/0203085 A1 | 8/2011 | Chen et al. | |
| 2011/0204475 A1* | 8/2011 | Rui et al. | 257/532 |
| 2013/0122681 A1* | 5/2013 | Malhotra et al. | 438/396 |

OTHER PUBLICATIONS

Tsai, Kou-Chiang et al., "High-Reliability Ta2O5 Metal-Insulator-Metal Capacitors With Cu-Based Electrodes", Journal of the Electrochemical Society, vol. 153, No. 5, 2006, pp. G492-G497.

Manceau, J.P. et al., "Metal-Insulator-Metal Capacitors' Current Instability Improvement Using Dielectric Stacks to Prevent Oxygen Vacancies Formation", Applied Physics Letters, vol. 91, 2007, pp. 132907-1-132907-3.

European Search Report, European Patent Application No. 12197801.9, dated Sep. 24, 2015.

Lalik, Erwin et al., "Mechanisms of Reduction of MoO3 to MoO2 Reconciled?", Journal of Physical Chemistry B, vol. 105, No. 38, Sep. 1, 2001, pp. 9153-9156.

Menou, N. et al., "Composition Influence on the Physical and Electrical Properties of SrxTi1-xOy-Based Metal-Insulator—Metal Capacitors Prepared by Atomic Layer Deposition Using TiN Bottom Electrodes", Journal of Applied Physics, American Institute of Physics, US., vol. 106, No. 9, Nov. 2, 2009, pp. 094101-1-094101-7.

* cited by examiner

METAL-INSULATOR-METAL STACK AND METHOD FOR MANUFACTURING THE SAME

CROSS REFERENCE TO RELATED APPLICATIONS

Pursuant to the provisions of 35 U.S.C. §119(b), this application claims priority to EP11194690.1 filed Dec. 20, 2011, the entire contents of which are incorporated herein by reference.

FIELD

The present invention relates to a method for manufacturing a metal-insulator-metal (MIM) stack, and the products resulting thereof.

BACKGROUND

There is a market need for manufacturing metal-insulator-metal (MIM) devices in applications that require a high level of miniaturization. In such applications, the challenge is to address the materials and manufacturing techniques that will provide the MIM products with the desired performance characteristics.

Generally, there is a desire to manufacture MIM devices presenting a low equivalent oxide thickness (EOT) and/or low leakage current density ($J_g$), since, for example, the smaller the EOT a dielectric material can achieve at a certain leakage level, the higher the capability of the MIM device to store charges.

U.S. Patent Application No. 2011/0204475 A1, for example, discloses a method of fabricating a semiconductor stack with higher dielectric constant and conveniently low EOT. It is proposed to use a dielectric material, e.g., $TiO_2$, in rutile phase in order to obtain a high dielectric value. Rutile is being formed after $TiO_2$ deposition on a preformed layer, e.g., $MoO_2$, with lattice matching characteristics, which can advantageously act as a template for the rutile $TiO_2$ growth.

A different approach to improve the performance of MIM devices, e.g., MIM capacitors based on $Ta_2O_5$ dielectric, is disclosed in the article "Metal-insulator-metal capacitors' current instability improvement using dielectric stacks to prevent oxygen vacancies formation", J.-P. Manceau et al., Applied Physics Letters, Volume 91, Issue 13, Dielectrics and Ferroelectricity, 26 Sep. 2007. This article discusses the reduction of leakage current instabilities due to the oxygen vacancies formed in the dielectric stack. More specifically, this article proposes the introduction of a thin stable dielectric layer, i.e., $Al_2O_3$, between the high-k dielectric, i.e., $Ta_2O_5$, and the electrodes, i.e., TiN, in order to prevent oxygen vacancy formation at interfaces.

A problem with the current techniques for manufacturing MIM devices is that oxygen vacancy suppression in the dielectric is not addressed.

SUMMARY

An improved MIM stack, and associated devices, which presents low EOT and/or low leakage current properties, using a technique that heals the oxygen vacancies in the dielectric of the MIM stack is described.

According to one embodiment, a method for manufacturing a metal-insulator-metal (MIM) stack is provided, the method comprising: forming a temporary stack by depositing a bottom electrode comprising at least one metal layer; depositing a dielectric comprising at least one layer of a dielectric material having a first dielectric constant value; and depositing a top electrode comprising at least one metal layer; wherein the step of depositing the bottom and/or top electrode further comprises depositing a non-conductive metal oxide layer directly in contact with the dielectric, the non-conductive metal oxide being in a metastable and high oxidation state; and after the step of depositing the bottom and/or top electrode's non-conductive metal oxide layer and the dielectric, subjecting the temporary stack to a stimulus, which transforms the non-conductive metal oxide into a thermodynamically stable oxide having conductive properties or into a metal, and the dielectric material into a crystalline form having a second dielectric constant value higher than the first dielectric constant value, thereby creating the final MIM stack.

The method for manufacturing the MIM stack allows for an improvement of the electrical properties of the MIM stack, at least by the reduction of the leakage current density ($J_g$), which further will allow the reduction of the physical thickness and consequently obtaining a lower EOT. The method allows the healing of oxygen deficiencies in the dielectric which appear as a result of the crystallization anneal. Therefore, also advantageously, the method allows the use of high dielectric constant materials and/or the reduction of the physical dimensions of the MIM stack. Some more advantages include, for example, increased integration capacity in an integrated circuit and/or increased reliability and performance.

According to another embodiment, the step of depositing at least one metal layer of the bottom and top electrode comprises depositing a metal layer that prevents diffusion of oxygen from the non-conductive metal oxide layer into the metal layer. This aspect allows for released oxygen to flow from the non-conductive metal oxide layer in the direction of the dielectric when the reduction occurs. The at least one metal layer may be, for example, a nitride compound. The nitride compound may be, for example, a tantalum nitride (TaN), a tungsten nitride (WN), a tungsten carbo nitride (WCN), a titanium aluminum nitride (TiAlN) or a tantalum aluminum nitride (TaAlN).

According to another embodiment, the non-conductive metal oxide in a metastable and high oxidation state includes a metal, which may be, for example, molybdenum (Mo), ruthenium (Ru), tungsten (W), or vanadium (V). More specifically, the non-conductive metal oxide in a metastable and high oxidation state may be, for example, molybdenum trioxide ($MoO_3$), ruthenium dioxide ($RuO_2$), tungsten trioxide ($WO_3$), or vanadium pentoxide ($V_2O_5$).

According to still another embodiment, the thickness of the non-conductive metal oxide layer is equal or smaller than 2 nm, and preferably between 1 and 2 nm. Preferably the non-conductive metal oxide layer is kept as thin as possible in order to reduce rugged film formation that occurs with thicker films when changing the oxidation state. The at least one metal layer of the top and bottom electrode has a thickness preferably equal or greater than 5 nm.

Also according to an embodiment, the stimulus that allows transforming the non-conductive metal oxide into a thermodynamically stable oxide having conductive properties or transforming the non-conductive metal oxide into a metal, and transforming the at least one layer of dielectric material having a first dielectric constant value into a crystalline form having a second dielectric constant value higher than that first dielectric constant value, is one or a combination of a thermal, pressure, and/or radiation stimulus in a neutral or reducing environment.

These embodiments also relate to a MIM stack and associated devices, e.g., electronic memories, integrated circuits, or batteries, comprising one or a plurality of the MIM stacks manufactured according to the method described herein. Advantageously, a MIM stack manufactured according to the method described herein displays at least a lower leakage current density compared with similar MIM stacks not manufactured according to this method.

Certain objects and advantages of various inventive aspects have been described above. It is to be understood that not necessarily all such objects or advantages may be achieved in accordance with any particular embodiment. Those skilled in the art will recognize that the invention may be embodied or carried out in a manner that achieves or optimizes one advantage or group of advantages without necessarily achieving other objects or advantages as may be taught or suggested herein.

BRIEF DESCRIPTION OF THE DRAWINGS

The above and other aspects of the invention will be apparent from the following description and with reference to the non-restrictive example embodiment(s) described hereinafter.

DETAILED DESCRIPTION

In the following, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This is however not to be interpreted as the invention requiring more features than the ones expressly recited in each claim, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art.

In the description of the embodiments, numerous specific details are set forth. However, it is understood that embodiments of the invention may be practiced without these non-essential specific details. In other instances, well-known methods, structures and techniques have not been shown in detail in order not to obscure an understanding of this description.

Figure 1:
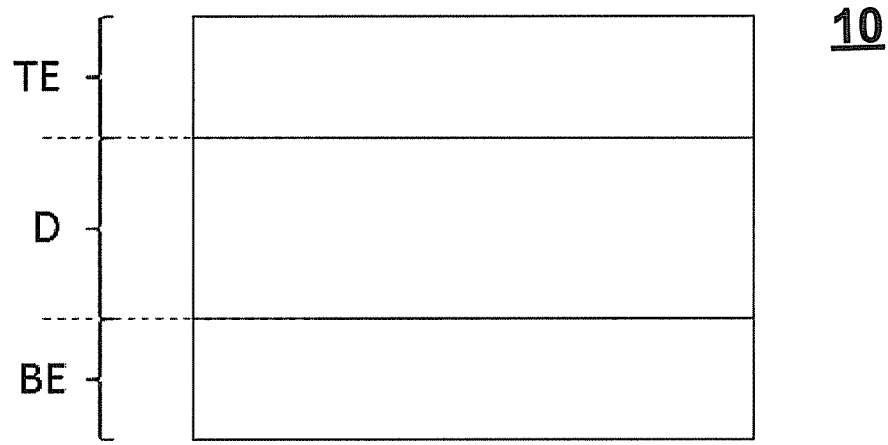
FIG. 1 is a block diagram that shows a general view of a MIM stack.

FIG. 1 shows a general view of a MIM stack 10, the stack 10 comprising a bottom electrode BE, a dielectric D, and a top electrode TE.

It should be understood that the embodiment of FIG. 1 is a simplified view of a MIM stack, and that, as is known by the person skilled in the art, the bottom and top electrodes BE and TE, and the dielectric D can comprise just one or a plurality of layers, which cooperate to provide a conductive or an insulating property respectively. The MIM stack 10 may be resting in any position and may be fixed to a certain material or layer in an electronic or integrated circuit.

When using the term "layer" or "film" in the following description, it shall be understood as used to refer either to a layer with homogeneous composition comprising one or more materials or compounds, or to a certain amount of material or compound which is deposited to achieve either sparse or complete layer coverage.

Also in the following, the term "first" or "second," and the numbers in the figures, are just mere means used to distinguish some elements of the figures and shall not be understood as being related to a method deposition order. For example, a "second layer" may be deposited, when manufacturing a MIM stack according to the invention, in a step previous to a referred "first layer," and a certain "first layer" may be deposited, when manufacturing a MIM stack according to the invention, before or after another different "first layer."

It shall also be understood that, in the following embodiments, the thickness of the layers may be preferably set to a certain value, but the thickness may vary depending on the specific embodiment, although the layer providing the same function according to the invention.

Figure 2:
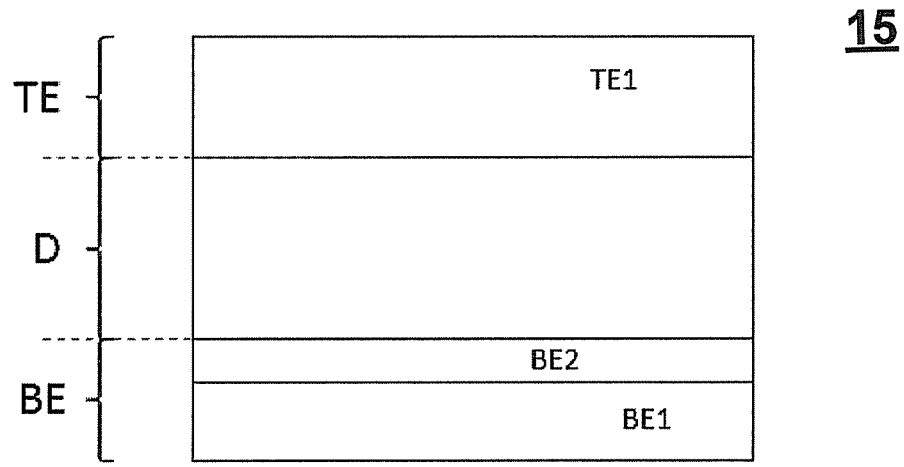
FIG. 2 is a block diagram that shows one embodiment of a MIM stack manufactured according to an example.

According to one embodiment, a final MIM stack 15 is illustrated in FIG. 2, comprising a first bottom electrode layer BE1, a second bottom electrode layer BE2, a dielectric D and a first top electrode layer TE1.

According to one embodiment, the first bottom electrode layer BE1 and the first top electrode layer TE1 are made of a metal, preferably with a thickness equal or greater than 5 nm. According to another embodiment, the first bottom electrode layer BE1, and/or the first top electrode layer TE1, are/is made of a metal including a compound which prevents diffusion of oxygen into the metal layer, such as for example, a nitride compound or an indium oxide. The nitride compound may be, for example, a tantalum nitride (TaN), a tungsten nitride (WN), a tungsten carbo nitride (WCN), a titanium aluminum nitride (TiAlN) or a tantalum aluminum nitride (TaAlN).

The second bottom electrode layer BE2 is a bottom electrode interface layer positioned between the first bottom electrode layer BE1 and the dielectric D. The second bottom electrode layer BE2 is made of a metal or of a thermodynamically stable metal oxide having conductive properties, the metal being preferably molybdenum (Mo), ruthenium (Ru), tungsten (W), or vanadium (V), and the thermodynamically stable metal oxide having conductive properties being molybdenum dioxide ($MoO_2$), tungsten dioxide ($WO_2$), or vanadium dioxide ($VO_2$). The second bottom electrode layer BE2 has a thickness preferably of 1 to maximum 2 nm.

The dielectric D is preferably strontium titanate (SrTiO$_3$) in crystalline form, having a dielectric constant value of at least 90, but another type of dielectric material in crystalline form may be used, for example TiO$_2$ crystallized in rutile phase, having a dielectric constant value of at least 80. The thickness of the dielectric layer is preferably in the range of 6 to 9 nm.

For manufacturing the MIM stack 15 of FIG. 2, there is provided a method according to the invention comprising the steps explained hereinafter. Some of these steps will be explained with reference to FIG. 3.

In a first step, the first bottom electrode layer BE1 is deposited.

Figure 3:
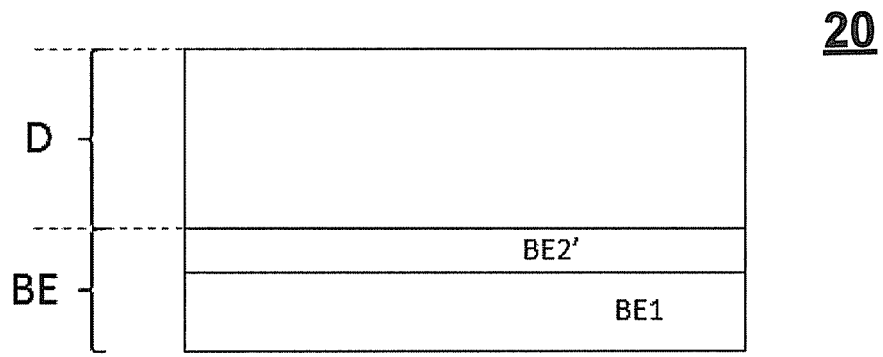
FIG. 3 is a block diagram that shows a temporary stack resulting at an early stage for manufacturing the MIM stack of FIG. 2, according to an example.

In a second step, a second bottom electrode layer BE2', as shown in FIG. 3, made of or comprising a non-conductive metal oxide in a metastable and high oxidation state, is deposited.

In a third step, a dielectric compound having a first dielectric constant value is deposited over the second bottom electrode layer BE2'.

In a fourth step, after depositing the first bottom electrode layer BE1, the second bottom electrode layer BE2' and the dielectric D, the resulting temporary stack 20, as shown in FIG. 3, is subjected to a stimulus in order to transform the non-conductive metal oxide of the second bottom electrode layer BE2' into a metal or into a thermodynamically stable oxide having conductive properties, thereby releasing oxygen via reduction. At the same time, that stimulus is also used to transform the dielectric having a first dielectric constant value into a dielectric having a second dielectric constant value higher than the initial one.

According to one embodiment, the desorption of oxygen from the non-conductive metal oxide in a metastable and high oxidation state via reduction by an external stimulus (e.g., a thermal treatment in a neutral or reducing atmosphere) takes place concomitantly with the conversion of the dielectric D into a crystalline phase having a second dielectric constant value higher than the value as initially deposited. Therefore, for example, the non-conductive layer becomes conductive and the dielectric compound reaches its final dielectric constant value (the second dielectric constant value) during an in situ anneal of the temporary stack 20. Advantageously, according to the invention, the in situ stimulation process of the temporary stack 20 ensures the full benefit of the second bottom electrode layer conversion where the desorbed oxygen (O$_2$) will directly contribute to fill the oxygen vacancies or defects in the dielectric, which also reaches its final dielectric constant value in the process (e.g., from STO amorphous into STO crystalline). This therefore takes place in a single step.

In a fifth step, the first top electrode layer TE1 is deposited over the dielectric D in order to produce the MIM stack 15 of FIG. 2.

Figure 4:
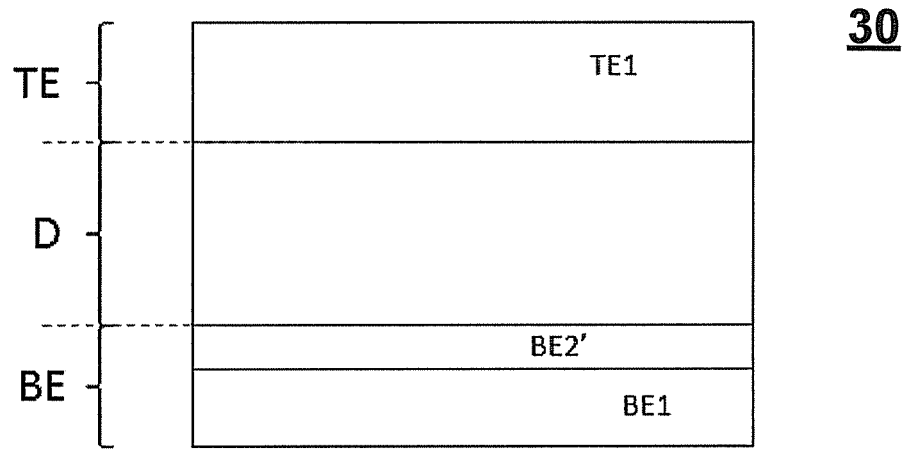
FIG. 4 is a block diagram that shows another temporary stack resulting at an early stage for manufacturing the MIM stack of FIG. 2, according to an example.

According to another embodiment, the fourth and fifth steps above are interchangeable, and therefore, after depositing the first bottom electrode layer BE1, the second bottom electrode layer BE2', the dielectric D, and the first top electrode layer TE1, the resulting temporary stack 30, as shown in FIG. 4, is subjected to a stimulus in order to transform the non-conductive metal oxide of the second bottom electrode layer BE2' into a metal or into a thermodynamically stable oxide having conductive properties, thereby releasing oxygen via reduction. At the same time, that stimulus is also used to transform the dielectric having a first dielectric constant value into a dielectric having a second dielectric constant value higher than the first one.

According to one embodiment, the non-conductive metal oxide compound in a metastable and high oxidation state of the second bottom electrode layer BE2' includes a metal such as for example, molybdenum (Mo), ruthenium (Ru), tungsten (W), or vanadium (V). According to another embodiment, the non-conductive metal oxide compound in a metastable and high oxidation is, for example, molybdenum trioxide (MoO$_3$), ruthenium dioxide (RuO$_2$), tungsten trioxide (WO$_3$), or vanadium pentoxide (V$_2$O$_5$). There are various known ways to deposit these oxide compounds, preferably by atomic layer deposition (ALD).

As an example, according to one embodiment of the invention, when the stimulus is applied to the temporary stack 20 of FIG. 3 or the temporary stack 30 of FIG. 4, molybdenum trioxide (MoO$_3$) is transformed or reduced into molybdenum dioxide (MoO$_2$) or into molybdenum (Mo). According to another example, ruthenium dioxide (RuO$_2$) is transformed or reduced into Ruthenium (Ru). According to still another example tungsten trioxide (WO$_3$) is transformed or reduced into tungsten dioxide (WO$_2$) or tungsten (W). According to still another example vanadium pentoxide (V$_2$O$_5$) is transformed or reduced into vanadium dioxide (VO$_2$) or vanadium (V).

For the reduction to occur, a plurality of known reduction processes can be applied. For example, a thermal treatment can be applied to the stack during anneal in a neutral (e.g., using nitrogen), inert (e.g., using argon or helium), and/or reducing atmosphere (e.g., using hydrogen). But other stimuli could also be applied to achieve the reduction, such as using radiation or pressure.

According to one embodiment, the dielectric compound initially deposited is strontium titanate (SrTiO$_3$) in amorphous state, having a first dielectric constant value, e.g., 16, and when the stimulus is applied to the temporary stack 20 of FIG. 3 or the temporary stack 30 of FIG. 4, the dielectric is transformed into strontium titanate (SrTiO$_3$) in crystalline form, having a dielectric constant value of at least 90, that is, a second dielectric constant value higher than the one presenting when the dielectric compound was deposited. According to another embodiment, the dielectric compound initially deposited is the anatase TiO$_2$ having a first dielectric constant value, e.g. 40, and is transformed into TiO$_2$ crystallized in rutile phase, having a dielectric constant value of at least 80.

According to another embodiment, the second bottom electrode layer BE2' has a thickness equal or smaller than 2 nm in order to reduce the roughening of the interface during phase change from non-conductive metastable and high oxidation state to the thermodynamically stable low oxidation state having conductive properties or metal state. Preferably, the second bottom electrode layer BE2' is kept as thin as possible in order to reduce rugged film formation which will occur with thicker films when changing the oxidation state.

According to one embodiment, the first bottom electrode layer BE1 and the first top electrode layer TE1 is made of a metal, preferably with a thickness equal or greater than 5 nm. According to another embodiment, the first bottom electrode layer BE1 is made of a metal including a compound that prevents diffusion of oxygen into the metal layer. Therefore, the first bottom electrode layer BE1 acts as a diffusion barrier, which prevents oxygen from the second bottom electrode layer BE2', while the temporary stack 20, 30 is subjected to the transformation stimulus, to migrate out of the stack and to ensure directionality of the oxygen towards the dielectric D.

Such diffusion barrier function can be provided, for example, by a nitride compound. The nitride compound may be, for example, a tantalum nitride (TaN), a tungsten nitride (WN), a tungsten carbo nitride (WCN), a titanium aluminum nitride (TiAlN), or a tantalum aluminum nitride (TaAlN).

Figure 5:
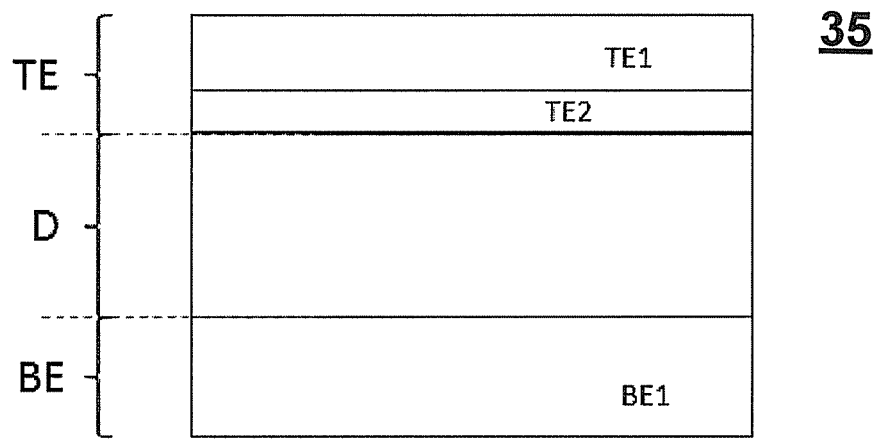
FIG. 5 is a block diagram that shows another embodiment of a MIM stack manufactured according to an example.

According to another embodiment, a final MIM stack 35 is illustrated in FIG. 5, comprising a first bottom electrode layer BE1, a dielectric D, a first top electrode layer TE1 and a second top electrode layer TE2.

According to one embodiment, the first top electrode layer TE1 is made of a metal, preferably with a thickness equal or greater than 5 nm. According to another embodiment, the first top electrode layer TE1 is made of a metal including a compound that prevents diffusion of oxygen into the metal layer, such as for example, a nitride compound. The nitride compound may be, for example, a tantalum nitride (TaN), a tungsten nitride (WN), a tungsten carbo nitride (WCN), a titanium aluminum nitride (TiAlN) or a tantalum aluminum nitride (TaAlN).

The second top electrode layer TE2 is a top electrode interface layer positioned between the first top electrode layer TE1 and the dielectric D. The second top electrode layer TE2 is made of a metal or a thermodynamically stable oxide having conductive properties; the metal being preferably molybdenum (Mo), ruthenium (Ru), tungsten (W), or vanadium (V), and the thermodynamically stable metal oxide having conductive properties being molybdenum dioxide ($MoO_2$), tungsten dioxide ($WO_2$), or vanadium dioxide ($VO_2$). The second top electrode layer TE2 has a thickness preferably of 1 to maximum 2 nm.

The dielectric D is preferably strontium titanate ($SrTiO_3$) in crystalline form, having a dielectric constant value of at least 90, but another type of dielectric material in crystalline form may be used, for example $TiO_2$ crystallized in rutile phase, having a dielectric constant value of at least 80. The thickness of the dielectric layer is preferably in the range of 6 to 9 nm.

For manufacturing the MIM stack 35 of FIG. 5, there is provided a method comprising the steps explained hereinafter. Some of these steps will be explained with reference to FIG. 6.

In a first step, the first bottom electrode layer BE1 is deposited.

In a second step, a dielectric compound having a first dielectric constant value is deposited over the first bottom electrode layer BE1.

Figure 6:
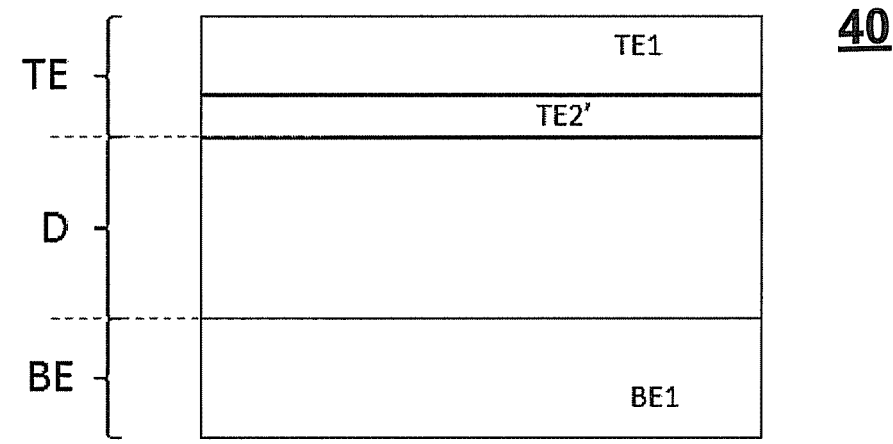
FIG. 6 is a block diagram that shows a temporary stack resulting at an early stage for manufacturing the MIM stack of FIG. 5, according to an example.

In a third step, a second top electrode layer TE2', as shown in FIG. 6, made of or comprising a non-conductive metal oxide in a metastable and high oxidation state, is deposited over the dielectric D.

In a fourth step, the first top electrode layer TE1 is deposited over the second top electrode layer TE2', as shown in FIG. 6.

In a fifth step, after depositing the first bottom electrode layer BE1, the dielectric D, second top electrode layer TE2' and the first top electrode layer TE1, the resulting temporary stack 40, as shown in FIG. 6, is subjected to a stimulus in order to transform the non-conductive metal oxide of the second top electrode layer TE2' into a metal or into a thermodynamically stable oxide having conductive properties. At the same time, that stimulus is also used to transform the dielectric having a first dielectric constant value into a dielectric having a second dielectric constant value higher than the initial one.

According to one embodiment, the desorption of oxygen from the non-conductive metal oxide in a metastable and high oxidation state via reduction by an external stimulus (e.g., a thermal treatment in a neutral or reducing atmosphere) takes place concomitantly with the conversion of the dielectric D into a crystalline phase having a second dielectric constant value higher than the value as initially deposited. Therefore, for example, the non-conductive layer becomes conductive and the dielectric compound reaches its final dielectric constant value (the second dielectric constant value) during an in situ anneal of the temporary stack 40. Advantageously, according to the invention, the in situ stimulation process of the temporary stack 40 ensures the full benefit of the second bottom electrode layer conversion where the released oxygen ($O_2$) will be directly incorporated into the dielectric, thereby healing of the oxygen vacancies of the dielectric, which also reaches its final dielectric constant value in the process (e.g., STO amorphous into STO crystalline). This therefore takes place in a single step.

According to one embodiment of the invention, the non-conductive metal oxide compound in a metastable and high oxidation state of the second top electrode layer TE2' includes a metal such as for example, molybdenum (Mo), ruthenium (Ru), tungsten (W), or vanadium (V). According to another embodiment, the non-conductive metal oxide compound in a metastable and high oxidation is, for example, molybdenum trioxide ($MoO_3$), ruthenium dioxide ($RuO_2$), tungsten trioxide ($WO_3$), or vanadium pentoxide ($V_2O_5$). There are various known ways to deposit these oxide compounds, preferably by atomic layer deposition (ALD).

As an example, according to one embodiment, when the stimulus is applied to the temporary stack 40 of FIG. 6, molybdenum trioxide ($MoO_3$) is transformed into molybdenum dioxide ($MoO_2$) or into molybdenum (Mo). According to another example, ruthenium dioxide ($RuO_2$) is transformed into Ruthenium (Ru). According to still another example tungsten trioxide ($WO_3$) is transformed into tungsten dioxide ($WO_2$) or tungsten (W). According to still another example vanadium pentoxide ($V_2O_5$) is transformed into vanadium dioxide ($VO_2$) or vanadium (V).

For the transformation to occur, a plurality of known transformation or conversion processes can be applied. For example, a thermal treatment can be applied to the stack during anneal in a neutral (e.g., using nitrogen), inert (e.g., using argon or helium), and/or reducing atmosphere (e.g., using hydrogen). But other stimuli could also be applied to achieve the transformation, such as using radiation or pressure.

According to one embodiment, the dielectric compound initially deposited is strontium titanate ($SrTiO_3$) in amorphous state, having a first dielectric constant value, e.g., 16, and when the stimulus is applied to the temporary stack 40 of FIG. 6, the dielectric is transformed into strontium titanate ($SrTiO_3$) in crystalline form, having a dielectric constant value of at least 90, that is, a second dielectric constant value higher than the one presenting when the dielectric compound was deposited. According to another embodiment, the dielectric compound initially deposited is the anatase $TiO_2$ having a first dielectric constant value, e.g., 40, and is transformed into $TiO_2$ crystallized in rutile phase, having a dielectric constant value of at least 80.

According to another embodiment, the second top electrode layer TE2' has a thickness equal or smaller than 2 nm in order to reduce the roughening of the interface during phase change from non-conductive metastable and high oxidation state to the thermodynamically stable low oxidation state having conductive properties or metal state. Preferably, the second top electrode layer TE2' is kept as thin as possible in order to reduce rugged film formation which will occur with thicker films when changing the oxidation state.

According to one embodiment, the first bottom electrode layer BE1 and the first top electrode layer TE1 are made of a metal, preferably with a thickness equal or greater than 5 nm. According to another embodiment of the invention, the first top electrode layer TE1 is made of a metal including a compound which prevents diffusion of oxygen into the metal layer. Therefore, the first top electrode layer TE1 acts as a diffusion barrier, which prevents oxygen from the second bottom electrode layer BE2', while the temporary stack 40 is subjected to the transformation stimulus, to migrate out of the stack and to ensure directionality of the oxygen towards the dielectric D. Such diffusion barrier function can be provided, for example, by a nitride compound. The nitride compound may be, for example, a tantalum nitride (TaN), a tungsten nitride (WN), a tungsten carbo nitride (WCN), a titanium aluminum nitride (TiAlN) or a tantalum aluminum nitride (TaAlN).

Figure 7:
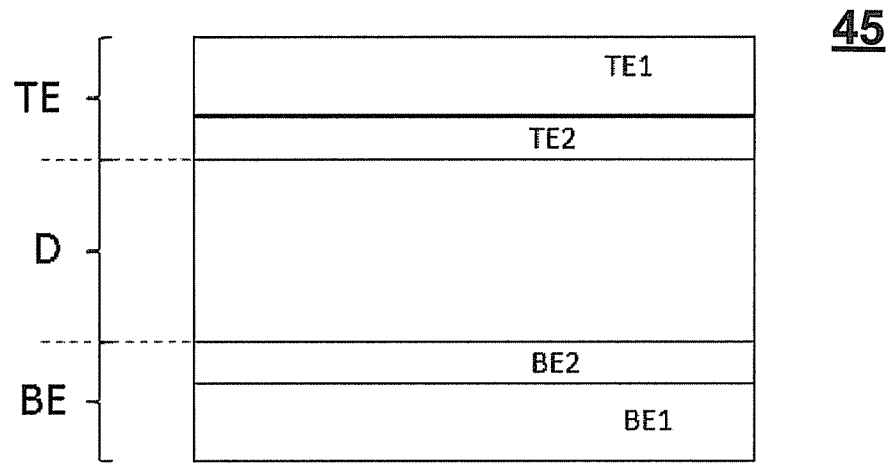
FIG. 7 is a block diagram that shows still another embodiment of a MIM stack manufactured according to an example.

According to still another embodiment, a final MIM stack 45 is illustrated in FIG. 7, comprising a first bottom electrode layer BE1, a second bottom electrode layer BE2, a dielectric D, a first top electrode layer TE1 and a second top electrode layer TE2.

The second bottom electrode layer BE2 is a bottom electrode interface layer positioned between the first bottom electrode layer BE1 and the dielectric D.

The second top electrode layer TE2 is a top electrode interface layer positioned between the first top electrode layer TE1 and the dielectric D.

For manufacturing the MIM stack 45 of FIG. 7, there is provided a method comprising the steps explained hereinafter. Some of these steps will be explained with reference to FIG. 8.

In a first step, the first bottom electrode layer BE1 is deposited.

Figure 8:
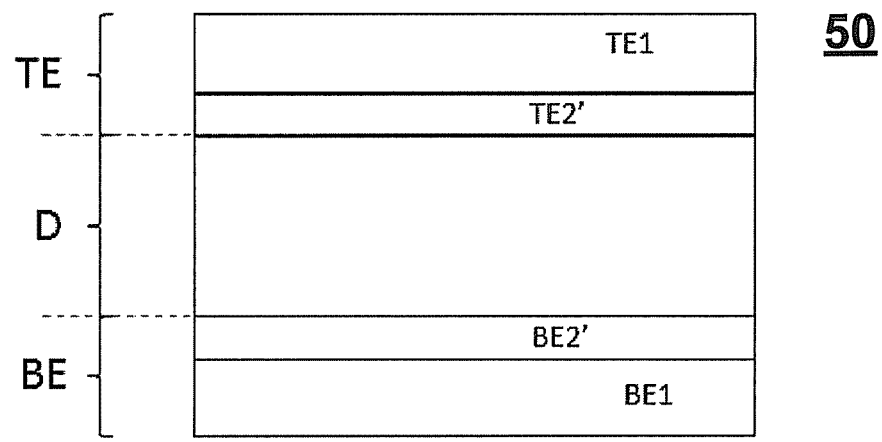
FIG. 8 is a block diagram that shows a temporary stack resulting at an early stage for manufacturing the MIM stack of FIG. 7, according to an example.

In a second step, a second bottom electrode layer BE2', as shown in FIG. 8, made of or comprising a non-conductive metal oxide in a metastable and high oxidation state, is deposited.

In a third step, a dielectric compound having a first dielectric constant value is deposited over the second bottom electrode layer BE2'.

In a fourth step, a second top electrode layer TE2', as shown in FIG. 8, made of or comprising a non-conductive metal oxide in a metastable and high oxidation state, is deposited over the dielectric D.

In a fifth step, the first top electrode layer TE1 is deposited over the second top electrode layer TE2', as shown in FIG. 8.

In a sixth step, after depositing the first bottom electrode layer BE1, the second bottom electrode layer BE2', the dielectric D, the second top electrode layer TE2' and the first top electrode layer TE1, the resulting temporary stack 50, as shown in FIG. 8, is subjected to a stimulus in order to transform the non-conductive metal oxide, of the second bottom electrode layer BE2' and the second top electrode layer TE2', into a metal or into a thermodynamically stable oxide having conductive properties. At the same time, that stimulus is also used to transform the dielectric having a first dielectric constant value into a dielectric having a second dielectric constant value higher than the initial one.

As can be appreciated by the person skilled in the art, the method for manufacturing a MIM stack 45 according to the embodiment of FIG. 7 is a combination of features for manufacturing the MIM stacks 15, 35 according to the embodiments described with respect to FIGS. 2 and 5.

According to one embodiment, a different non-conductive metal oxide in a metastable and high oxidation state may be used in the second bottom electrode layer BE2' and the second top electrode layer TE2'.

The invention claimed is:

1. A method for manufacturing a metal-insulator-metal (MIM) stack, comprising:
    forming a temporary stack by:
        depositing a bottom electrode comprising at least one metal layer;
        depositing a dielectric comprising at least one layer of a dielectric material having a first dielectric constant value; and
        depositing a top electrode comprising at least one metal layer;
        wherein depositing at least one of the bottom electrode or the top electrode includes depositing a non-conductive metal oxide layer directly in contact with the dielectric, wherein the non-conductive metal oxide is in a metastable and high oxidation state; and
    after depositing the non-conductive metal oxide layer and the dielectric, subjecting the temporary stack to a stimulus to cause the non-conductive metal oxide layer to release oxygen and transform into a thermodynamically stable oxide having conductive properties or into a metal, and to cause the dielectric to incorporate the released oxygen and transform into a crystalline form having a second dielectric constant value higher than the first dielectric constant value.

2. The method according to claim 1, wherein the at least one metal layer of the bottom or top electrodes prevents diffusion of the released oxygen from the non-conductive metal oxide layer into the metal layer.

3. The method according to claim 1, wherein the at least one metal layer is a nitride of tantalum (Ta), tungsten (W), carbon (C), aluminum (Al), titanium (Ti), or a combination thereof, and wherein the non-conductive metal oxide layer includes one or more of molybdenum (Mo), ruthenium (Ru), tungsten (W), or vanadium (V).

4. The method according to claim 3, wherein the non-conductive metal oxide layer is includes one or more of molybdenum trioxide ($MoO_3$), ruthenium dioxide ($RuO_2$), tungsten trioxide ($WO_3$), or vanadium pentoxide ($V_2O_5$).

5. The method according to claim 1, wherein a thickness of the non-conductive metal oxide layer is equal to or less than 2 nm, and wherein a thickness of the at least one metal layer is equal to or greater than 5 nm.

6. The method according to claim 1, wherein the stimulus is one or more of a thermal, pressure, or radiation stimulus in a neutral or reducing environment.

7. The method according to claim 1, further comprising subjecting the temporary stack to a stimulus to cause the non-conductive metal oxide layer to release oxygen and transform into a thermodynamically stable oxide having conductive properties or into a metal, and concomitantly to cause the dielectric to directly incorporate the released oxygen and transform into a crystalline form having a second dielectric constant value higher than the first dielectric constant value.

* * * * *